United States Patent
Fujimoto et al.

(10) Patent No.: US 9,548,322 B2
(45) Date of Patent: Jan. 17, 2017

(54) DISPLAY DEVICE

(71) Applicant: Japan Display Inc., Minato-ku (JP)

(72) Inventors: Takamitsu Fujimoto, Tokyo (JP); Tetsuya Iizuka, Tokyo (JP)

(73) Assignee: Japan Display Inc., Minato-ku (JP)

( * ) Notice: Subject to any disclaimer, the term of this patent is extended or adjusted under 35 U.S.C. 154(b) by 73 days.

(21) Appl. No.: 14/560,229

(22) Filed: Dec. 4, 2014

(65) Prior Publication Data

US 2015/0162352 A1 Jun. 11, 2015

(30) Foreign Application Priority Data

Dec. 6, 2013 (JP) .................................. 2013-252951

(51) Int. Cl.
H01L 27/01 (2006.01)
H01L 27/12 (2006.01)
G02F 1/1345 (2006.01)

(52) U.S. Cl.
CPC ........... *H01L 27/124* (2013.01); *G02F 1/1345* (2013.01); *H01L 27/1222* (2013.01)

(58) Field of Classification Search
CPC .................................................. G09G 3/3648
See application file for complete search history.

(56) References Cited

U.S. PATENT DOCUMENTS

| | | | | |
|---|---|---|---|---|
| 5,835,177 A * | 11/1998 | Dohjo | ................... | G02F 1/1345 257/59 |
| 5,920,082 A * | 7/1999 | Kitazawa | .......... | G02F 1/136227 257/59 |
| 7,102,718 B1 * | 9/2006 | Yamazaki | ......... | G02F 1/134363 257/E27.111 |
| 2010/0133539 A1 * | 6/2010 | Kang | ..................... | H01L 27/12 257/59 |

FOREIGN PATENT DOCUMENTS

JP 2004 272028 9/2004

* cited by examiner

*Primary Examiner* — Nimeshkumar Patel
*Assistant Examiner* — Jacob R Stern
(74) *Attorney, Agent, or Firm* — Oblon, McClelland, Maier & Neustadt, L.L.P.

(57) ABSTRACT

According to one embodiment, a wiring substrate includes a pad group of a first pad to supply a power source voltage of low level, a second pad to supply a power source voltage of high level, and a third pad to supply a necessary signal for displaying an image, a common line, a first connection line to connect the first pad with the common line, a second connection line to connect the second pad with the common line, and a third connection line to connect the third pad with the common line, wherein the first connection line and the second connection line are formed of polysilicon in which no impurity is doped, and the third connection line and the common line are formed of polysilicon in which an impurity is doped.

19 Claims, 5 Drawing Sheets

DISPLAY DEVICE

CROSS-REFERENCE TO RELATED APPLICATIONS

This application is based upon and claims the benefit of priority from Japanese Patent Application No. 2013-252951, filed Dec. 6, 2013, the entire contents of which are incorporated herein by reference.

FIELD

Embodiments described herein relate generally to a wiring substrate and a display device.

BACKGROUND

Display panels such as liquid-crystal panels and organic electroluminescent panels are, for example, thin, light, and energy efficient, and, because of these features, are used in various ways such as in OA equipment including personal computers, TVs, mobile devices including mobile phones, car navigation systems, and portable game consoles.

In such a display panel, to prevent electrostatic damage to the display by static electricity produced in the manufacturing process, various countermeasures are adopted. As an example of such antistatic measures, there is a technique known in this field to interpose a high resistance between an inspection terminal and a common line. As a high resistance available, there are the one formed thinner than the other lines and intentionally wound, the one with a static electricity protection TFT, and the one with a capacitance part composed of a pair of electrodes opposed to each other via a dielectric therebetween.

In a manufacturing process using the above technique, what is demanded is that an accurate inspection for pattern abnormality and electrical failure is performed while the static damage is suppressed in order to prevent a decrease in productivity.

DETAILED DESCRIPTION

In general, according to one embodiment, a wiring substrate includes: a pad group of a first pad to supply a power source voltage of low level, a second pad to supply a power source voltage of high level, and a third pad to supply a necessary signal for displaying an image; a common line; a first connection line to connect the first pad with the common line; a second connection line to connect the second pad with the common line; and a third connection line to connect the third pad with the common line, wherein the first connection line and the second connection line are formed of polysilicon in which no impurity is doped, and the third connection line and the common line are formed of polysilicon in which an impurity is doped.

According to one embodiment, a display device includes: a wiring substrate with a first pad to supply a power source voltage of low level, a second pad to supply a power source voltage of high level, a third pad to supply a necessary signal for displaying an image, a first connection line connected with the first pad, a second connection line connected with the second pad, and a third connection line connected with the third pad; and a countersubstrate opposed to the wiring substrate, wherein the first connection line and the second connection line are formed of polysilicon in which no impurity is doped, and the third connection line and the common line are formed of polysilicon in which an impurity is doped.

Hereinafter, embodiments are described with reference to the accompanying drawings. Note that the disclosure herein is for the sake of exemplification, and any modification and variation conceived within the scope and spirit of the invention by a person having ordinary skill in the art are naturally encompassed in the scope of invention of the present application. Furthermore, a width, thickness, shape, and the like of each element are depicted schematically in the Figures for the sake of simpler explanation as compared to actual embodiments, and they are not to limit the interpretation of the invention of the present application. Furthermore, in the description and Figures of the present application, structural elements functioning the same or similarly are referred to by the same reference numbers and detailed explanations considered redundant may be omitted.

Figure 1:
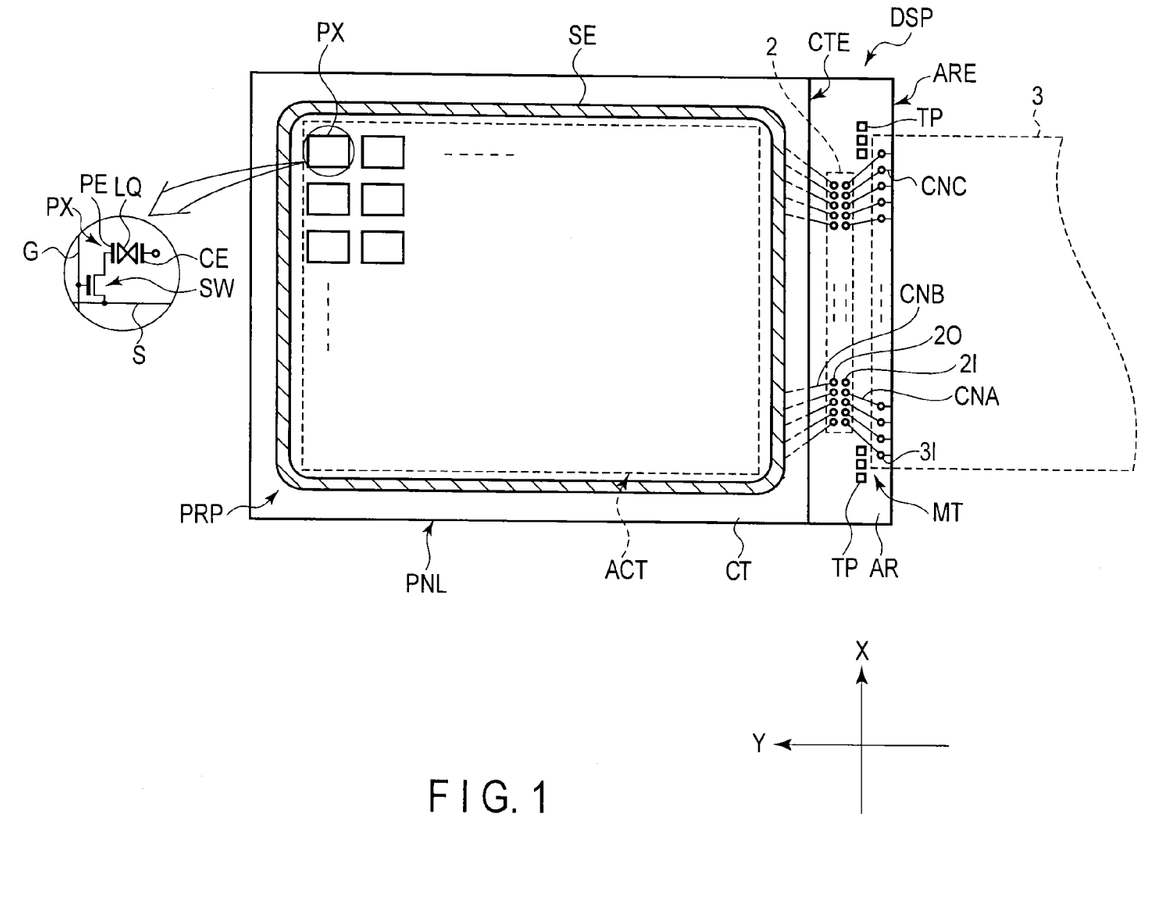
FIG. 1 is a plan view which schematically shows a display device DSP of an embodiment.

FIG. 1 is a plan view which schematically shows a display device DSP of an embodiment.

The display device DSP depicted in the Figure includes a display panel PNL which is a liquid crystal display panel of active matrix type; however, it may be an organic electroluminescent display device including an organic electroluminescent display panel.

That is, the display panel PNL includes an array substrate AR, a countersubstrate CT opposed to the array substrate AR, and a liquid crystal layer LQ interposed between the array substrate AR and the countersubstrate CT. The array substrate AR and the countersubstrate CT are bonded to each other with a sealant SE while a predetermined cell gap is formed therebetween. The liquid crystal layer LQ is maintained inside an area surrounded by the sealant SE in the cell gap between the array substrate AR and the countersubstrate CT. In such a display panel PNL, an active area ACT for displaying an image is disposed inside the area surrounded by the sealant SE. The active area ACT is composed of a plurality of pixels PX.

The array substrate AR is formed by cutting a wiring substrate of the embodiment as described later. The array substrate AR includes a plurality of gate lines G extending in a first direction X, a plurality of source lies S extending in a second direction Y which crosses the first direction X, a switching element SW connected to the gate line G and the source line S, and a pixel electrode PE connected to the switching element SW. Common electrode CE opposed to its respective pixel electrode via a liquid crystal layer LQ is provided with, for example, the countersubstrate CT; however, it may be provided with the array substrate AR instead.

Note that, the display panel PNL is configured for both a mode in which a vertical field is mainly such as a twisted nematic (TN) mode, optically compensated bend (OCB)

mode, and vertical aligned (VA) mode, and a mode in which a transverse field is mainly used such as in-plane switching (IPS) mode and fringe field switching (FFS) mode. In the configuration for the vertical field using mode, the pixel electrode PE is provided with the array substrate AR while the common electrode CE is provided with the countersubstrate CT. In the configuration for the transverse field using mode, both the pixel electrode PE and the common electrode CE are provided with the array substrate AR.

Signal suppliers such as driving IC chip 2 and flexible printed circuit (FPC) 3 which supply necessary signals for driving the display panel PNL are positioned in a periphery area PRP outside the active area ACT. The driving IC chip 2 includes a gate driver connected to the gate line G and a source driver connected to the source line S.

The array substrate AR includes a mount MT which extends along the second direction Y to be outside a substrate end CTE of the countersubstrate CT. The mount MT includes a plurality of input pads 2I and a plurality of output pads 2O at a position where the driving IC chip 2 is mounted. Furthermore, the mount MT includes a plurality of input pads 3I at a position where an FPC 3 is mounted. The input pads 3I and the input pads 2I are connected to each other, respectively, through connection lines CNA. Various lines in the active area ACT such as the gate line G and source line S are connected to the output pads 2O, respectively, through circumferential lines CNB. Connection lines CNC are connected to input pads 3I, respectively. The connection lines CNC are drawn out to a substrate end ARE of the array substrate AR. Furthermore, the mount MT includes a plurality of test pads TP. The test pads TP are provide with, for example, a middle part of the connection line CNA.

Figure 2:
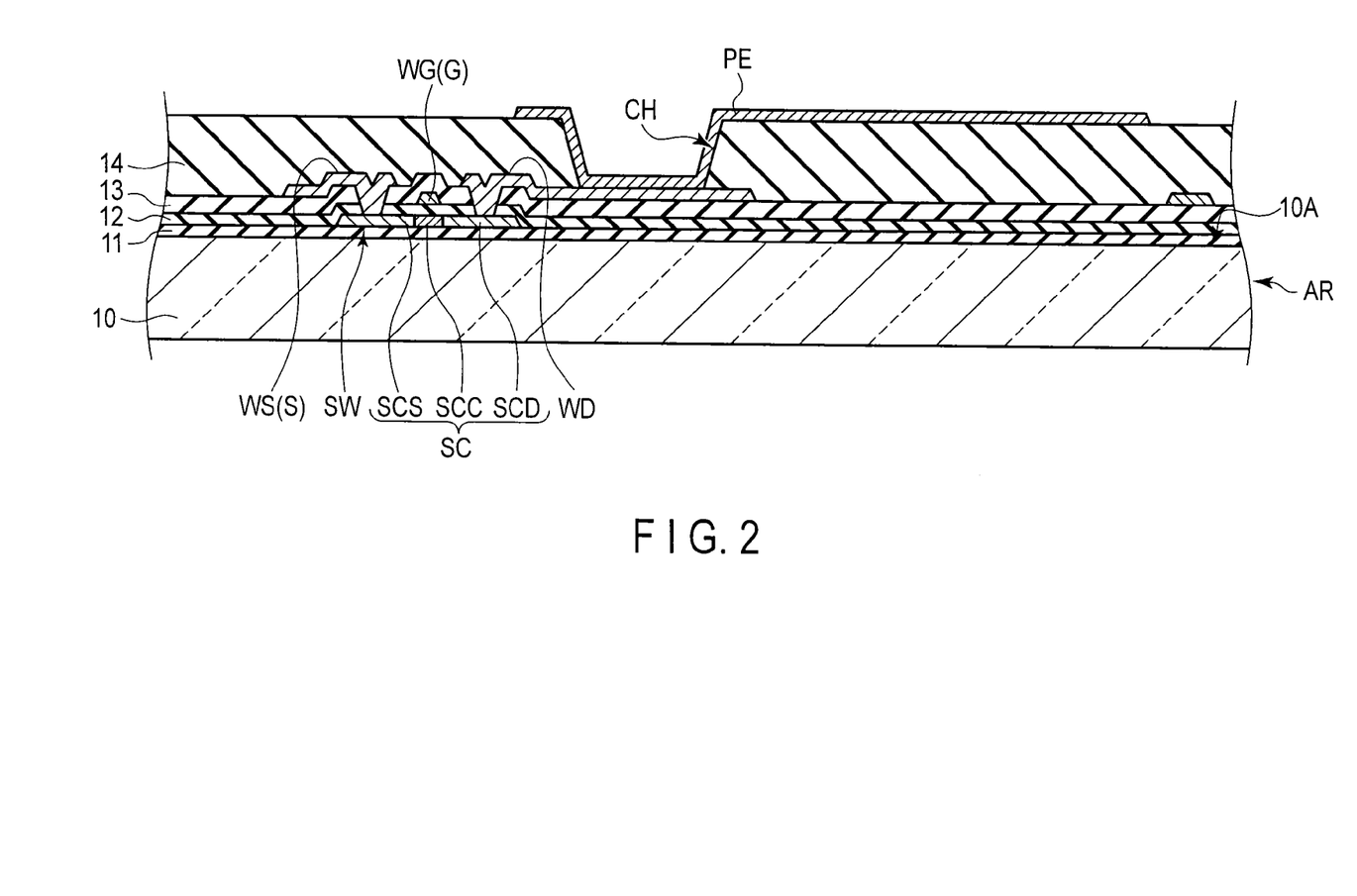
FIG. 2 is a cross-sectional view which schematically shows the structure of an array substrate AR in a display panel PNL in FIG. 1.

FIG. 2 is a cross-sectional view which schematically shows a structural example of an array substrate AR of the display panel PNL of FIG. 1.

That is, the array substrate AR includes a first insulating substrate 10 which exhibits light transmittance such as a glass substrate. The array substrate AR includes, on the first insulating substrate 10, a switching element SW, pixel electrode PE, first insulating film 11, second insulating film 12, third insulating film 13, and fourth insulating film 14.

The first insulating film 11 is an undercoat layer which covers an inner surface 10A of the first insulating substrate 10. The switching element SW is, for example, a thin film transistor of top gate type and includes a semiconductor layer SC formed on the first insulating film 11. The semiconductor layer SC is formed of, for example, polysilicon. The semiconductor layer SC includes a source region SCS, a drain region SCD, and a channel region SCC between the source region SCS and the drain region SCD. The channel region SCC corresponds to a high resistance region in which almost no impurity is doped into the polysilicon. The source region SCS and the drain region SCD correspond to a low resistance region in which highly concentrated n+ impurity is doped into the polysilicon. The semiconductor layer SC is covered with the second insulating film 12. The second insulating film 12 covers the first insulating film 11, too.

The gate electrode WG of the switching element SW is formed on the second insulating film 12 and is positioned directly above the channel region SCC. The gate electrode WH is electrically connected to the gate line G. Otherwise, the gate electrode WH is formed integrally with the gate line G. The gate electrode WG is covered with the third insulating film 13. The third insulating film 13 covers the second insulating film 12, too.

The source electrode WS and the drain electrode WD of the switching element SW are formed on the third insulating film 13. The source electrode WS is electrically connected to the source line S.

Otherwise, the source electrode WS is formed integrally with the source line S. The drain electrode WD is separated from the source line S. The source electrode WS contacts the source region SCS through a contact hole passing through the second insulating film 12 and the third insulating film 13. The drain electrode WD contacts the drain region SCD through the contact hole passing through the second insulating film 12 and the third insulating film 13. The source electrode WS and the drain electrode WD are covered with the fourth insulating film 14. The fourth insulating film 14 covers the third insulating film 13, too.

The pixel electrode PE is formed on the fourth insulating film 14 and contacts the drain electrode WD through a contact hole CH passing through the fourth insulating film 14. The pixel electrode PE is formed of a transparent conductive material such as indium tin oxide (ITO) and indium zinc oxide (IZO).

Now, a wiring substrate (mother substrate) used for forming the array substrate AR is explained.

Figure 3:
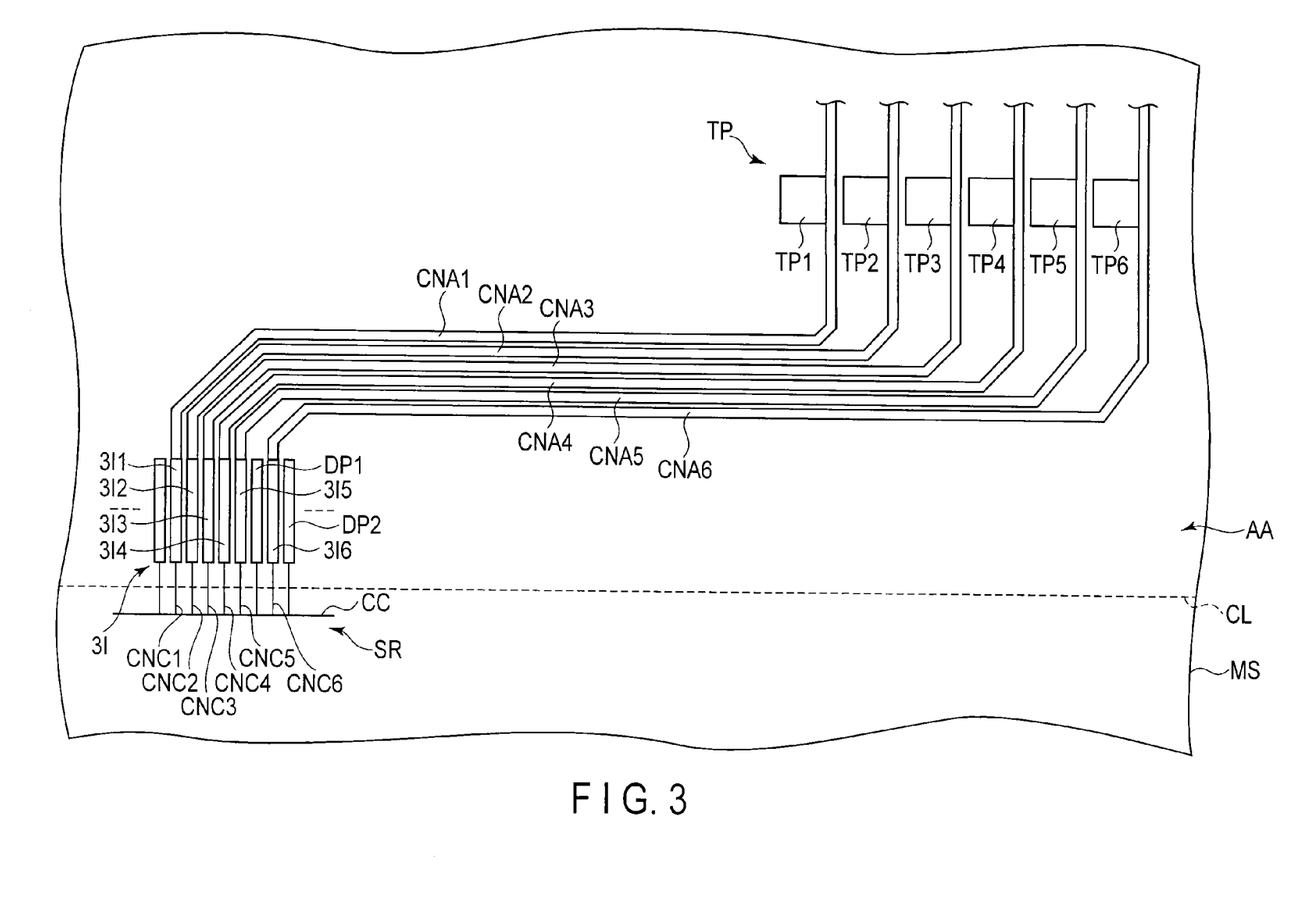
FIG. 3 is a plan view which schematically shows a layout example of input pads 3I and test pads TP in an available area AA corresponding to a single array substrate in the wiring substrate MS.

FIG. 3 is a plan view which schematically shows a layout example of the input pads 3I and test pads TP in an available area AA which corresponds to one array substrate of a wiring substrate MS.

A plurality of input pads 3I1 to 3I6 and dummy pads DP1 and DP2 compose a pad group which is positioned in the available area AA. That is, the input pads 3I1 to 3I6 and the dummy pads DP1 and DP2 are positioned inside a cutting line CL used to cut the available area AA from the wiring substrate MS. For example, the input pad 3I4 is a pad to supply low power source voltage VGL, the input pad 3I6 is a pad to supply high power source voltage VGH, and the other input pads 3I1, 3I2, 3I3, and 3I5 are pads used to supply necessary signals for displaying an image (or necessary signals for driving the gate and source drivers). The dummy pads DP1 and DP2 are not connected to any line and electrically floating. The dummy pad DP1 is positioned between the input pad 3I5 and the input pad 3I6. The dummy pad DP2 is adjacent to the input pad 3I6 at the opposed side to the dummy pad DP1.

Similarly, a plurality of test pads TP1 to TP6 are positioned inside the cutting line CL, that is, inside the available area AA. When a pattern abnormality and an electrical failure in the wiring substrate MS are inspected, a probe to supply a power source voltage and signal from a tester to the wiring substrate MS contacts test pads TP1 to TP6.

In the available area AA, the input pad 3I1 is connected to the connection line CNA1, the input pad 3I2 is connected to the connection line CNA2, the input pad 3I3 is connected to the connection line CNA3, the input pad 3I4 is connected to the connection line CNA4, the input pad 3I5 is connected to the connection line CNA5, and the input pad 3I6 is connected to the connection line CNA6. The connection line CNA1 is connected to test pad TP1, the connection line CNA2 is connected to test pad TP2, the connection line CNA3 is connected to test pad TP3, the connection line CNA4 is connected to test pad TP4, the connection line CNA5 is connected to test pad TP5, and the connection line CNA6 is connected to test pad TP6.

A common line CC is positioned outside the cutting line CL, that is, outside the available area AA. In other words, the cutting line CL is drawn between the common line CC and the input pads 3I. Thus, the common line CC does not remain on the available area AA, that is, the array substrate when the wiring substrate MS is cut along the cutting line CL. The connection lines CNC1 to CNC6 are drawn from the inside to the outside of the available area AA. The connection line CNC1 connects the input pad 3I1 with the common line CC, the connection line CNC2 connects the input pad 3I2 with the common line CC, the connection line CNC3 connects the input pad 3I3 with the common line CC, the connection line CNC4 connects the input pad 3I4 with the common line CC, the connection line CNC5 connects the input pad 3I5 with the common line CC, and the connection line CNC6 connects the input pad 3I6 with the common line CC. The common line CC and the connection lines CNC1 to CNC6 are electrically connected to each other and they forms a so-called shorting ring SR.

Figure 4:
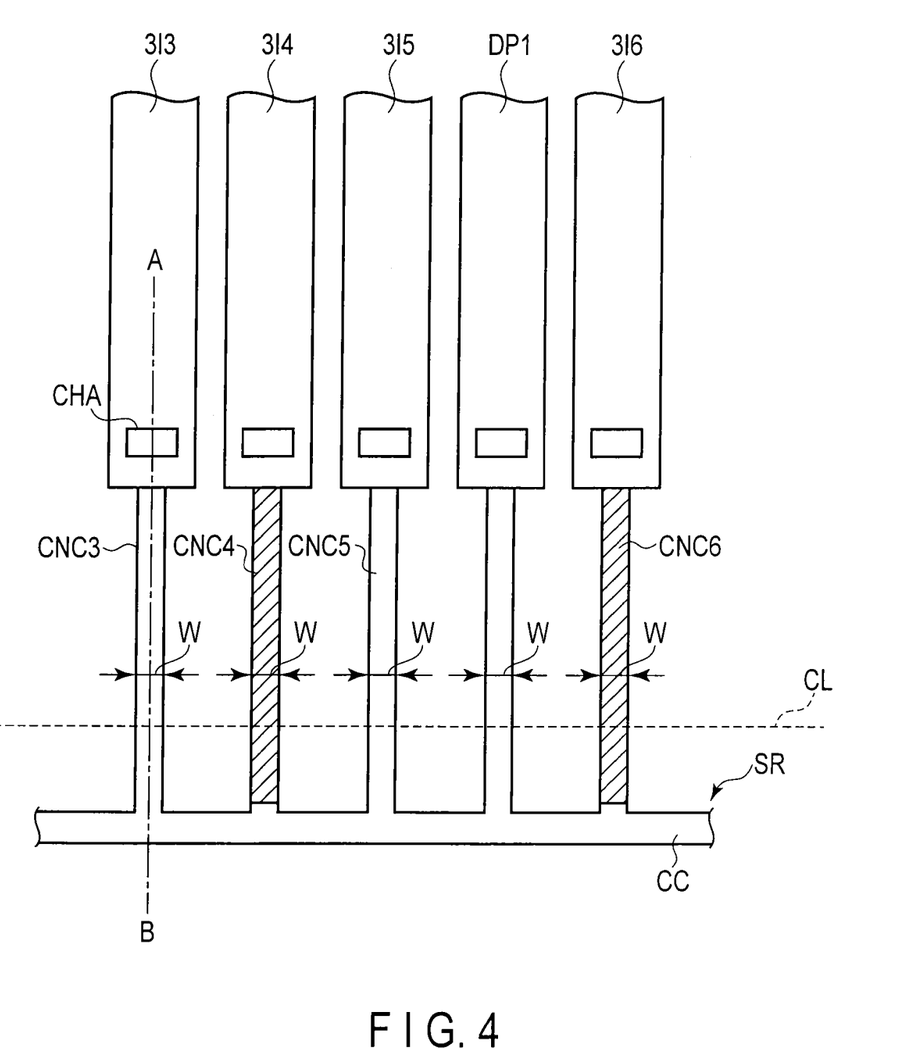
FIG. 4 is a plan view which shows a part of the input pads 3I and shorting ring SR in an enlarged manner.
Figure 5:
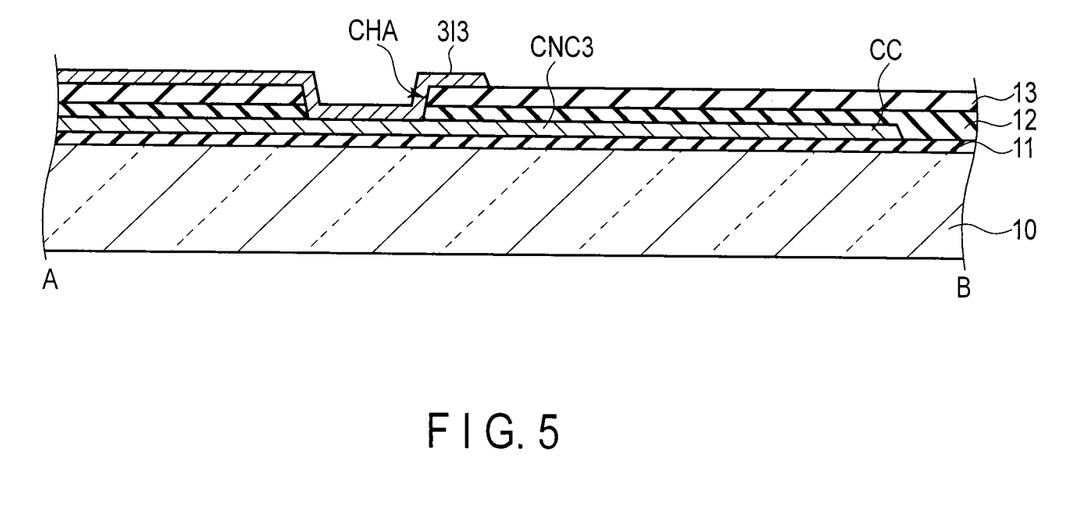
FIG. 5 is a cross-sectional view which schematically shows a structure of the input pad 3I3 and the connection line CNC3 taken along line A-B in FIG. 4.

FIG. 4 is a plan view which shows a part of the input pads 3I and the shorting ring SR in an enlarged manner. FIG. 5 is a cross-sectional view which schematically shows a structure of the input pad 3I3 and the connection line CNC3 taken along line A-B in FIG. 4.

The connection line CNC3 and the common line CC are positioned on the first insulating film 11 and are formed of the same material used for the semiconductor layer SC of the switching element SW in FIG. 2. That is, the connection line CNC3, common line CC, and semiconductor layer SC are all positioned on the first insulating film 11 and are formed of polysilicon. The other connection lines CNC4 to CNC6 are, similarly, positioned on the first insulating film 11 and formed of polysilicon. The connection line CNC3 is covered with the second insulating film 12. The input pad 3I3 is formed on the third insulating film 13 and contacts the connection line CNC3 through a contact hole CHA passing through the second insulating film 12 and the third insulating film 13. Note that the structure of the input pad 3I3 and the connection line CNC3 is mainly exemplified here, and since the structures of the input pads 3I4 to 3I6 and their respective connection lines CNC4 to CNC6 are the same, their detailed descriptions are omitted.

The connection lines CNC3 to CNC6 are formed linearly between the common line CC and their respective input pads 3I3 to 3I6. In the example depicted, the connection lines CNC3 to CNC6 individually extend in the direction orthogonal to the common line CC. Furthermore, the connection lines CNC3 to CNC6 have the same line width w in the direction of the extension of the common line CC.

The connection lines CNC4 and CNC6 are formed of polysilicon in which no impurity is doped, or polysilicon in which an extremely low concentration of impurity is doped. For example, the connection lines CNC4 and CNC6 have a concentration of impurity which is substantially equal to that of the channel region SCC formed as a high resistance region. This means that the high resistance region is not a region having a resistance which does not allow a current flow at all.

The other connection lines than the connection lines CNC4 and CNC6, namely, the connections lines CNC3 and CNC5 and the common line CC are formed of polysilicon in which an impurity is doped, or polysilicon in which an impurity concentrated higher than that of the connection lines CNC4 and CNC6 are doped. That is, the connection lines CNC3 and CNC5 and the common line CC have a concentration of impurity which is substantially equal to that of the source region SCS and the drain region SCD, and they are made low resistive.

The connection lines CNC4 and CNC6 formed of the polysilicon in which no impurity is doped have a different reflectivity than that of the connection lines CNC3 and CNC5 formed of the polysilicon in which some impurity is doped. Thus, they are distinguishable from each other by an optical measurement.

The shorting ring SR in such a structure is formed by, for example, exposing a region corresponding to the connection lines CNC3 and CNC5, the common line CC, and the like and doping an impurity therein over a mask shielding a region corresponding to the connection lines CNC4 and CNC6. At that time, what to be doped into the connection lines CNC3 and CNC5 and the common line CC should preferably be an n+ impurity such as phosphate (P) rather than a p+ impurity such as boron (B). The inventors of the present application have confirmed experimentally that the resistance measured when the n+ impurity was doped into polysilicon is less varied than the resistance measured when the p+ impurity was doped into polysilicon, and thus, a desired resistance could easily be achieved when the n+ impurity was doped.

Before the countersubstrate is bonded to the above wiring substrate MS, an inspection using a tester is performed, and then, cutting is performed along the cutting line CL. Before cutting, each of the input pads 3I is electrically connected to each other via the shorting ring SR in the wiring substrate MS, and thus, even if static electricity impinges on the input pads 3I during the manufacturing process of the wiring substrate MS, the energy of the static electricity is dissipated by the shorting ring SR which means that electrostatic damage can be prevented. Furthermore, the shorting ring SR includes the connection lines CNC4 and CNC6 which are highly resistive. Since the static electricity flowing into the shorting ring SR thus flows into the highly resistive connection lines CNC4 and CNC6, a greater amount of energy can be dissipated, and a possible high voltage can be prevented from being applied to the other connection lines and input pads.

In the inspection process, probes of a tester are connected to the test pads TP, respectively, and then, a power source voltage and various signals are supplied from the tester to the test pads TP through the probes to measure a pattern abnormality, electrical failure, and furthermore, current drawn. At that time, although the input pad 3I4 used to apply a low power source voltage and the input pad 3I6 used to apply a high power source voltage are electrically connected through the shorting ring SR, since the highly resistive connection lines CNC4 and CNC6 intervene therebetween, an overcurrent can be prevented from flowing during the inspection, and the tester can accurately measure the current drawn.

In the array substrate AR formed by cutting the wiring substrate MS, the common line within the shorting ring SR is removed, and thus, the input pads 3I are separated individually. Therefore, when these input pads 3I are connected to the terminals of the FPC 3, respectively, normal power source voltage and signals can be supplied through each input pad.

Furthermore, the dummy pads DP1 and DP2 are adjacent to the input pads 3I6 on its both sides. That is, between the input pad 3I6 and the other input pads 3I, floating dummy pads DP1 and DP2 are inserted. The voltage applied to the input pad 3I6 is set higher than the voltage applied to the other input pads 3I.

In a comparative example which does not include a dummy pad, ions were acknowledged due to a great potential difference between an input pad of high voltage and its adjacent input pads, and this may cause corrosion in the input pads.

The present embodiment with the dummy pads DP1 and DP2 can reduce the potential difference between the input pad 3I6 and the other input pads 3I as compared to the comparative example without a dummy pad. Thus, the present embodiment can inhibit corrosion due to ions which would be produced by the input pad 3I6 of high voltage and can improve the reliability of the final product.

As can be understood from the above, the present embodiment can provide a wiring substrate and a display device which can prevent a decrease in productivity.

The wiring substrate MS described in the present embodiment can be applied to various models, and namely, applied to display devices such as a liquid crystal display device and organic electroluminescent display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wiring substrate comprising:
a pad group including a first pad, a second pad, and a third pad;
an array substrate;
a first connection line connected to the first pad;
a second connection line connected to the second pad; and
a third connection line connected to the third pad, wherein
the first connection line and the second connection line are formed of polysilicon in which no impurity is doped,
the third connection line is formed of polysilicon in which an impurity is doped,
the third connection line is between the first connection line and the second connection line, and
edges of the first connection line, the second connection line, and the third connection line correspond to an edge of the array substrate.

2. The wiring substrate of claim 1, wherein the pad group is positioned in an available area corresponding to the array substrate in the wiring substrate, and a common line connected to the first connection line, the second connection line, and the third connection line is positioned outside the available area.

3. The wiring substrate of claim 1, further comprising:
a switching element that includes
a semiconductor layer including a source region, a drain region, and a channel region between the source region and the drain region,
a gate electrode opposed to the channel region,
a source electrode contacting the source region, and
drain electrode apart from the source electrode and contacting the drain region, wherein
the semiconductor layer is formed on an insulating film on which the first to third connection lines are formed alongside.

4. The wiring substrate of claim 1, wherein the first to third connection lines are individually formed linearly with the same line width.

5. The wiring substrate of claim 1, wherein the pad group includes a dummy pad adjacent to the first pad, or the second pad, or the third pad.

6. A display device comprising:
a wiring substrate that includes an array substrate, a first, a second pad, a third pad, a first connection line connected with the first pad, a second connection line connected with the second pad, and a third connection line connected with the third pad; and
a countersubstrate opposed to the wiring substrate, wherein
the first connection line and the second connection line are formed of polysilicon in which no impurity is doped,
the third connection line is formed of polysilicon in which an impurity is doped,
the third connection line is between the first connection line and the second connection line, and
edges of the first connection line, the second connection line, and the third connection line correspond to an edge of the array substrate.

7. The display device of claim 6, further comprising:
a switching element that includes
a semiconductor layer including a source region, a drain region, and a channel region between the source region and the drain region,
a gate electrode opposed to the channel region,
a source electrode contacting the source region, and
a drain electrode apart from the source electrode and contacting the drain region, wherein
the semiconductor layer is formed on an insulating film on which the first to third connection lines are formed alongside.

8. The display device of claim 6, wherein the first to third connection lines are individually formed linearly with the same line width.

9. The display device of claim 6, wherein the wiring substrate includes a dummy pad adjacent to the first pad, or the second pad, or the third pad.

10. The display device of claim 7, further comprising:
a pixel electrode formed on the wiring substrate and electrically connected with the switching element;
a common electrode opposed to the pixel electrode; and
a liquid crystal layer held between the wiring substrate and the countersubstrate.

11. The wiring substrate according to claim 1, wherein the first pad supplies a power supply voltage of low level, the second pad is supplies a power source voltage of high level, and the third pad supplies a necessary signal for displaying an image.

12. The wiring substrate according to claim 1, wherein:
the first connection line, the second connection line, and the third connection line run parallel to each other.

13. The wiring substrate according to claim 1, wherein the third pad is between the first pad and the second pad.

14. The wiring substrate according to claim 13, wherein the first pad, the second pad, and the third pad are arranged along a first direction.

15. The wiring substrate according to claim 13, wherein each of the first pad, the second pad, and the third pad extends in a second direction, the wiring substrate further comprising:
a fourth connection line connected to the first pad at an opposite end of the first pad in the second direction from where the first connection line is connected to the first pad;
a fifth connection line connected to the second pad at an opposite end of the second pad in the second direction from where the second connection line is connected to the second pad;

a sixth connection line connected to the third pad at an opposite end of the third pad from where the third connection line is connected to the third pad; and at least one of the fourth connection line, the fifth connection line, and the sixth connection line extends in a third direction perpendicular to the second direction.

16. The wiring substrate according to claim 15, further comprising:

a first test pad electrically connected to the first pad by the fourth connection line;

a second test pad electrically connected to the second pad by the fifth connection line; and a third test pad electrically connected to the third pad by the sixth connection line.

17. The wiring substrate according to claim 1, further comprising:

a fourth pad; and a fourth connection line connected to the fourth pad, the fourth pad including polysilicon in which an impurity is doped, wherein the first pad is between the third pad and the fourth pad.

18. The wiring substrate according to claim 1, wherein:

the edge of the array substrate is formed along a cutting line on the wiring substrate.

19. A wiring substrate comprising:

a pad group including a first pad, a second pad, and a third pad;

an array substrate;

a first connection line connected to the first pad;

a second connection line connected to the second pad; and a third connection line connected to the third pad, wherein the first connection line and the second connection line are formed of polysilicon in which an impurity is doped, the third connection line is formed of polysilicon in which no impurity is doped, the third connection line is between the first connection line and the second connection line, and edges of the first connection line, the second connection line, and the third connection line correspond to an edge of the array substrate.

* * * * *